United States Patent [19]

Kampes

[11] Patent Number: 4,737,735
[45] Date of Patent: Apr. 12, 1988

[54] PHANTOM POWERED AMPLIFIER

[76] Inventor: Donald P. Kampes, 12914 Fork Rd., Baldwin, Md. 21013

[21] Appl. No.: 889,339

[22] Filed: Jul. 25, 1986

[51] Int. Cl.$^4$ .............................................. H03F 3/04
[52] U.S. Cl. .................................... 330/297; 330/127
[58] Field of Search ............... 330/297, 254, 301, 127; 307/475

[56] References Cited

U.S. PATENT DOCUMENTS

| | | |
|---|---|---|
| 3,449,679 | 6/1969 | Attwood . |
| 3,454,896 | 7/1969 | Hofer . |
| 3,501,711 | 3/1970 | Moran . |
| 3,757,240 | 9/1973 | Fogg . |
| 3,828,280 | 8/1974 | Dolby . |
| 4,292,597 | 9/1981 | Niimura et al. .................. 330/254 |
| 4,296,383 | 10/1981 | Jeandot et al. ................... 330/301 |
| 4,369,411 | 1/1983 | Niimura et al. .................. 330/257 |
| 4,504,747 | 3/1985 | Smith et al. ...................... 307/475 |
| 4,551,636 | 11/1985 | Andrews et al. ................. 307/264 |
| 4,558,186 | 12/1985 | Stahl . |
| 4,631,493 | 12/1986 | Vandelin et al. ................. 330/297 |

OTHER PUBLICATIONS

Edward Simon, "Tech Tips", S & VC Buyers' Guide, Feb. 15, 1987, p. 56.

Primary Examiner—Gene Wan
Attorney, Agent, or Firm—Schwartz, Jeffery, Schwaab, Mack, Blumenthal & Evans

[57] ABSTRACT

A circuit for receiving unbalanced inputs and providing balanced outputs to a console wherein the console provides phantom power. The circuit isolates the phantom power to provide bias supply to the amplifier circuit which converts the unbalanced input to a balanced output.

10 Claims, 4 Drawing Sheets

PHANTOM POWERED AMPLIFIER

BACKGROUND OF THE INVENTION

1. Field of the Invention

This invention relates to power supplies for amplifiers, and particularly to a power supply which can be biased using phantom power derived from a signal carrying line.

2. Description of Related Art

In certain audio consoles it is customary to provide d.c. power along the audio signal receiving lines to bias certain types of microphones. This power is known as "phantom" power because it is provided on the same lines as the audio signal is received. Such audio consoles are used in recording studios, commercial sound systems, PA systems, and sound reinforcement systems.

Certain types of audio instruments provide an unbalanced output. Modern audio consoles require a balanced audio input. Accordingly, it is conventional to provide a device for interfacing low or high level unbalanced lines from the audio equipment to low level balanced inputs on the consoles. These devices normally are supplied with individual power supplies which may take the form of a battery pack or the like. Such devices which use battery packs require that the batteries be changed on a frequent basis. This operation proves to be inconvenient.

SUMMARY OF THE INVENTION

One object of a present invention is to provide a phantom powered active device for interfacing low or high level unbalanced lines from analog equipment to low level balanced inputs on audio consoles.

Another object of the present invention is to provide a phantom powered interface device which is compact and requires a minimum number of components.

A still further object of the present invention is to provide an interface device which uses phantom power and which provides both inverted and non-inverted audio signal outputs.

In accordance with the above and other objects, the present invention comprises a first connector for connection to a current carrying line to provide a.c. signals to the current carrying line and to receive d.c. power from the current carrying line. A second connector is provided for receiving a.c. signals. An amplifier circuit is also provided having an input for receiving a.c. signals from the second connector and having an output for providing a.c. signals to the first connector. Furthermore, circuitry is provided for biasing the amplifier circuit with the d.c. power from the first connector. This circuit isolates the d.c. power from the amplifier circuit output and contains a bias supply line connected to the first connector and isolates the bias supply line from the a.c. signals.

In accordance with other aspects of the invention, the current carrying line may comprise first and second conductors carrying the d.c. power. The amplifier circuit may provide inverted and non-inverted a.c. signals, respectively.

The current carrying line may further comprise a third conductor. The third conductor is grounded and the supply line is isolated from the a.c. signals by a first resistor connected between the first conductor and the bias supply line, a second resistor connected between the second conductor and the bias supply line, and a capacitor connected between the bias supply line and a third conductor.

BRIEF DESCRIPTION OF THE DRAWINGS

The above and other objects of the present invention will become more readily apparent as the invention is more clearly understood from the detailed description to follow, reference being had to the accompanying drawings in which like reference numerals represent like parts throughout, and in which.

DETAILED DESCRIPTION OF THE PREFERRED EMBODIMENTS

Figure 1:
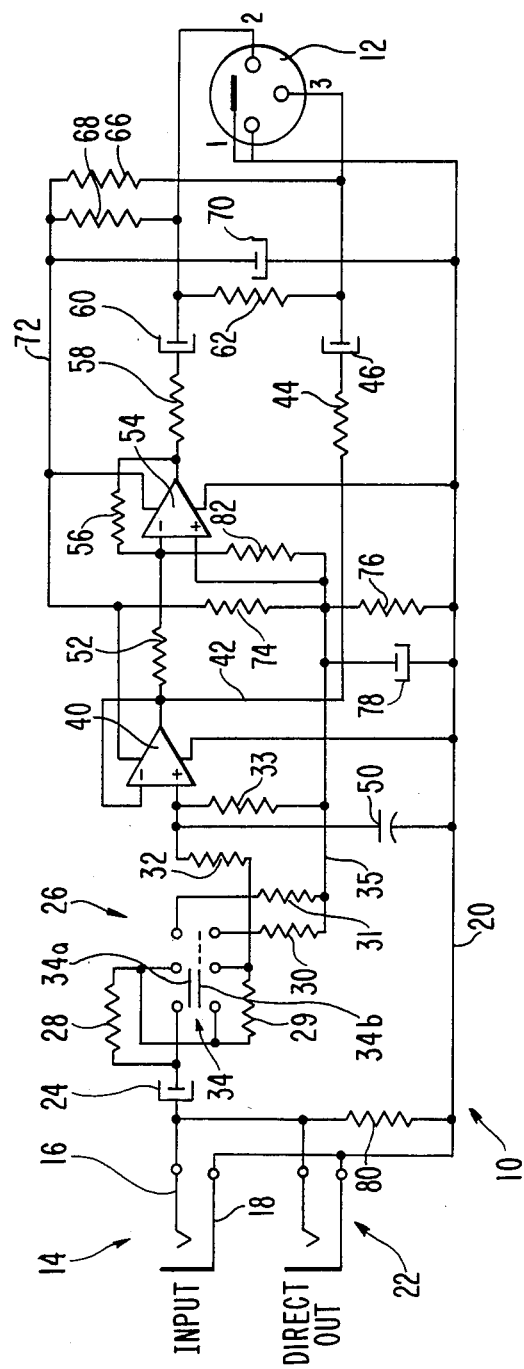
FIG. 1 is a first embodiment of the phantom powered interface circuit of the present invention.

The phantom powered interface circuit 10 shown in FIG. 1 comprises a three pinned connector 12 having three pins labeled 1, 2 and 3. Connector 12 connects to a cable leading to the audio input of an audio console. The audio console provides 24 or 48 volt power through a 2k to 5k ohm resistance to the pins 2 and 3. Pin 1 is grounded through the audio console.

An input 14 is a standard plug type input having two leads 16 and 18. Lead 18 connects to a wire 20 which is also connected to pin 1 of connector 12. Thus, lead 18 is grounded through pin 1 of connector 12. A direct output connector 22 is connected in parallel to connector 18 to provide a direct unbalanced output if desired.

Input audio signals are received through input connector 14 and lead 16. A blocking capacitor 24 blocks any d.c. components of the audio input signal and feeds the a.c. components to an input pad 26. Capacitor 24 may be 10 microfarad, 50 volt d.c. electrolytic capacitor.

Pad 26 comprises resistors 28 through 32 as well as a DPDT rocker-special three T action center position switch 34. Switch 34 has two contactors 34a and 34b and six contacts. The switch can assume one of three positions. In the first position, the contactors 34a and 34b are positioned as shown in FIG. 1. In the second position, contactor 34a remains as shown in FIG. 1 and contactor 34b moves to the right as shown in phantom in FIG. 1. In the third position, both contactors move to the right.

The input pad 26 is provided for the purpose of matching the voltage level provided by the device connected to input 14 to the input voltage level required by device 10 while maintaining a 100kohm input impedance. In the first position of switch 26, the input signal is provided through resistor 32 only. This is a current limiting input resistor for a first high input impedance voltage follower amplifier 40. With switch 26 in the first position, a zero db reduction in input signal is achieved. In the second position of switch 26, the input is divided by a voltage divider comprising resistors 29 and 30. The divided voltage is applied to amplifier 40 through resistor 32. It should be noted that resistor 30 is connected to line 35 which comprises an ac ground by virtue of a capacitor 78, to be discussed below.

In the third position, the input signal is first divided by a voltage divider comprising resistors 28 and 31, resistor 31 being connected to ac ground line 35, and the divided signal is divided again by a voltage divider comprising resistors 29 and 30 with the output of this voltage divider being applied through resistor 32.

From pad 26 the audio signal is provided to high input impedance voltage follower amplifier 40 which is connected in a unity gain configuration. Amplifier 40 provides a non-inverted output on line 42 through a resistor 44 and a capacitor 46 to prong 3 of connector 12. Resistor 44 provides a 20 db drop in the output signal, which is required for the input to the audio console, and capacitor 46 isolates the output of amplifier 40 from the phantom d.c. voltage on prong 3 of connector 12.

A capacitor 50 is connected to the non-inverting input of amplifier 40 to shunt rf frequencies to ground in order to reduce noise.

The output of unity gain amplifier 40 is provided through a resistor 52 to a differential amplifier 54. Amplifier 54 is connected in a negative feedback configuration through a feedback resistor 56. The output of amplifier 54 is passed through a resistor 58 to provide a 20 db drop in the signal level and through a capacitor 60 which isolates the phantom d.c. on pin 2 from the amplifier output. An output resistor 62 is connected between capacitors 60 and 48 to provide a total output impedance of 150 ohms to match the input impedance of the audio console.

The d.c. voltage of pins 2 and 3 of connector 12 is passed through resistors 66 and 68 which are connected in series between pins 2 and 3. A capacitor 70 is connected at the junction of resistors 66 and 68 for filtering a.c. voltages to ground at pin 1. Accordingly, filtered d.c. is available on line 72. This filtered d.c. is provided to the positive power pin of amplifiers 40 and 54. The negative power pin of each amplifier is connected to ground through line 20.

A high impedance precision voltage divider and filter comprising voltage dividing resistors 74 and 76 and capacitor 78 also receives the supply voltage from line 72. Capacitor 78 holds line 35 at an ac ground while resistors 74 and 76 provide a zero centering voltage for amplifiers 40 and 54 to hold the output of each amplifier in the center of its dynamic range. The zero centering voltage for the amplifier 40 is provided through resistor 33 to the non-inverting input of amplifier 40 and is provided directly to the non-inverting input of amplifier 54.

It will be noted that capacitor 24 isolates the input 14 from the zero centering voltage established by resistors 74 and 76. A bleed resistor 80 is connected to the negative side of capacitor 24 to provide a path to ground so as to maintain this side of capacitor 24 at ground level.

It should also be noted that, while resistors 80 and 33 do not form part of pad 26, the resistance values of these elements must be taken into account when calculating the input impedance to input connector 14. This input impedance should be maintained at 100Kohms regardless of the position of switch 34.

Amplifier 54 is connected to a unity gain configuration. To keep the input impedance low and still have unity gain, the input signal is divided between resistor 52 and resistor 82. Resistor 82 is connected between the inverting input of amplifier 54 and ac ground line 35. Resistors 52, 82 and 56 have the same value of 3.32Kohms.

In operation, an input device such as a microphone, synthesizer, instrument or the like is connected to input 14 and the switch 34 is positioned to provide the appropriate output. For example, the first position is used to provide a zero db output for an instrument, the second position provides a minus 10 db output for use with synthesizer and the third position provides a minus 20 db output for use with an amplifier. Connector 12 is attached to a console having phantom power so that pins 2 and 3 are provided with, for example, 24 volt or 48 volt d.c. power. The voltage at pins 2 and 3 is taken off through resistors 68 and 66 and filtered by capacitor 70. This voltage is applied to the positive bias terminals of amplifiers 40 and 54 while the negative bias terminals of these amplifiers is connected to pin 1.

As a.c. signals are received at input 14, they are passed through pad 26 to amplifier 40 whose output is held at the middle of the amplifier dynamic range by a voltage produced by resistors 74 and 76 and applied through resistor 33. This signal is filtered by capacitor 78 which holds line 34 at an a.c. ground.

The output of amplifier 40 is divided by resistors 52 and 82 and applied to amplifier 54 which is connected in a unity gain configuration. The voltage produced by the voltage divider comprising resistors 74 and 76 is applied directly to the non-inverting input of amplifier 54 to hold the amplifier output in the center of the operating range.

The output of amplifier 40 is non-inverted and passed through resistor 44 and capacitor 46 to pin 3. The output of amplifier 54 is inverted and passed through resistor 58 and capacitor 60 to pin 2. Resistors 44, 58 and 62 provide at 20 db drop to match the output signal and impedance to that required by the console. Accordingly, the signals of pins 2 and 3 comprise inverted and non-inverted balance representations of the input signal 20 db below the level present at the non-inverting input of amplifier 40.

Figure 2:
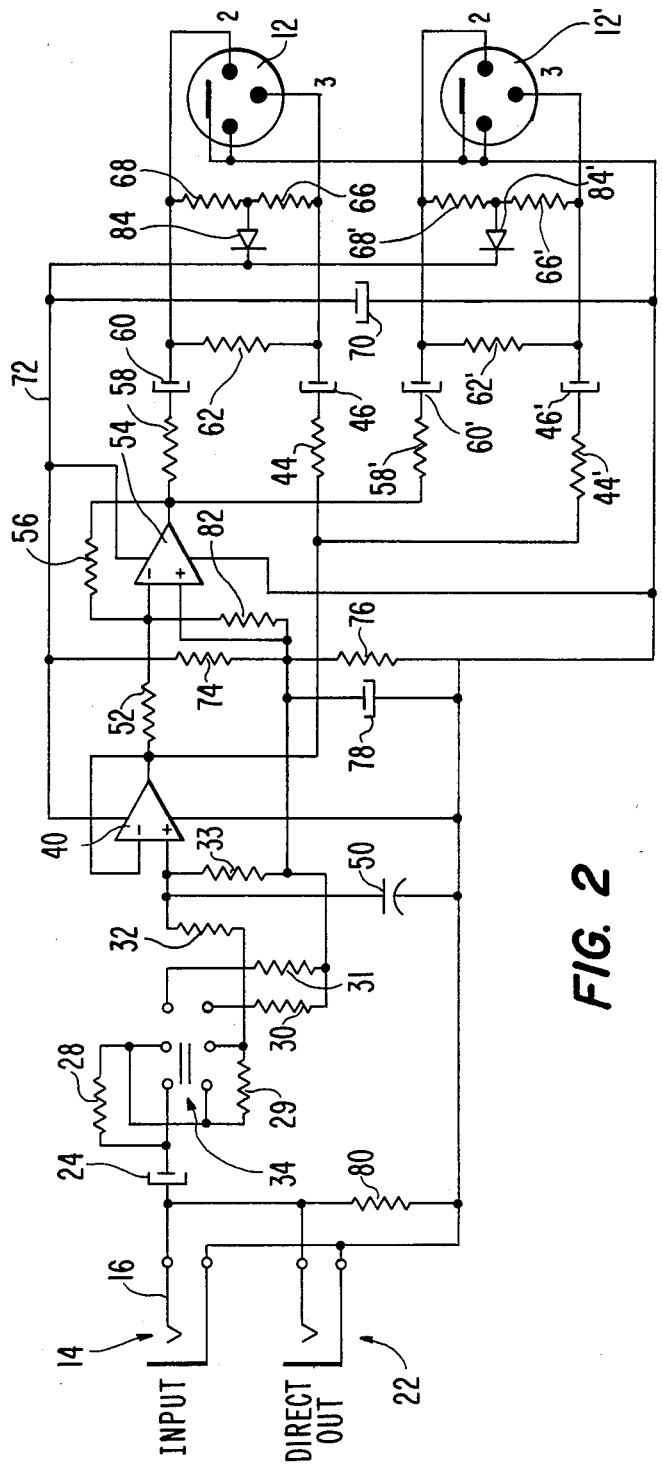
FIG. 2 is a second embodiment of the phantom powered interface circuit of the present invention.

FIG. 2 shows an embodiment of the present invention which is similar to the embodiment of FIG. 1 except that two output connectors 12 and 12' are provided. Connectors 12 and 12' are connected in parallel so that the device in FIG. 2 acts as a spliter. One input can be split onto two different channels of the same console, or two different consoles, as would be used when a live concert is recorded using an independent console. Either or both consoles can have phantom power and the unit will work satisfactorily, but the best operation occurs when both consoles are phantom powered.

The circuitry leading to connector 12' is identical to that leading to connector 12 and is labeled similarly except for the addition of a' ; to each reference numeral.

Line 72 is connected to the junction between resistors 66 and 68 in the embodiment of FIG. 2 through a steering diode 84. A similar diode 84' connects line 72 to the junction between resistors 66' and 68'. Diodes 84 and 84' isolate the phantom power supplies at connectors 12 and 12' from each other so that one console can have a 24 volt supply and the other a 48 volt supply with no adverse effects. The current draw would be approximately 3.8 mA from the console with the higher voltage supply. If both consoles have identical phantom power voltages, then one half of the current will be drawn from each.

Figure 3:
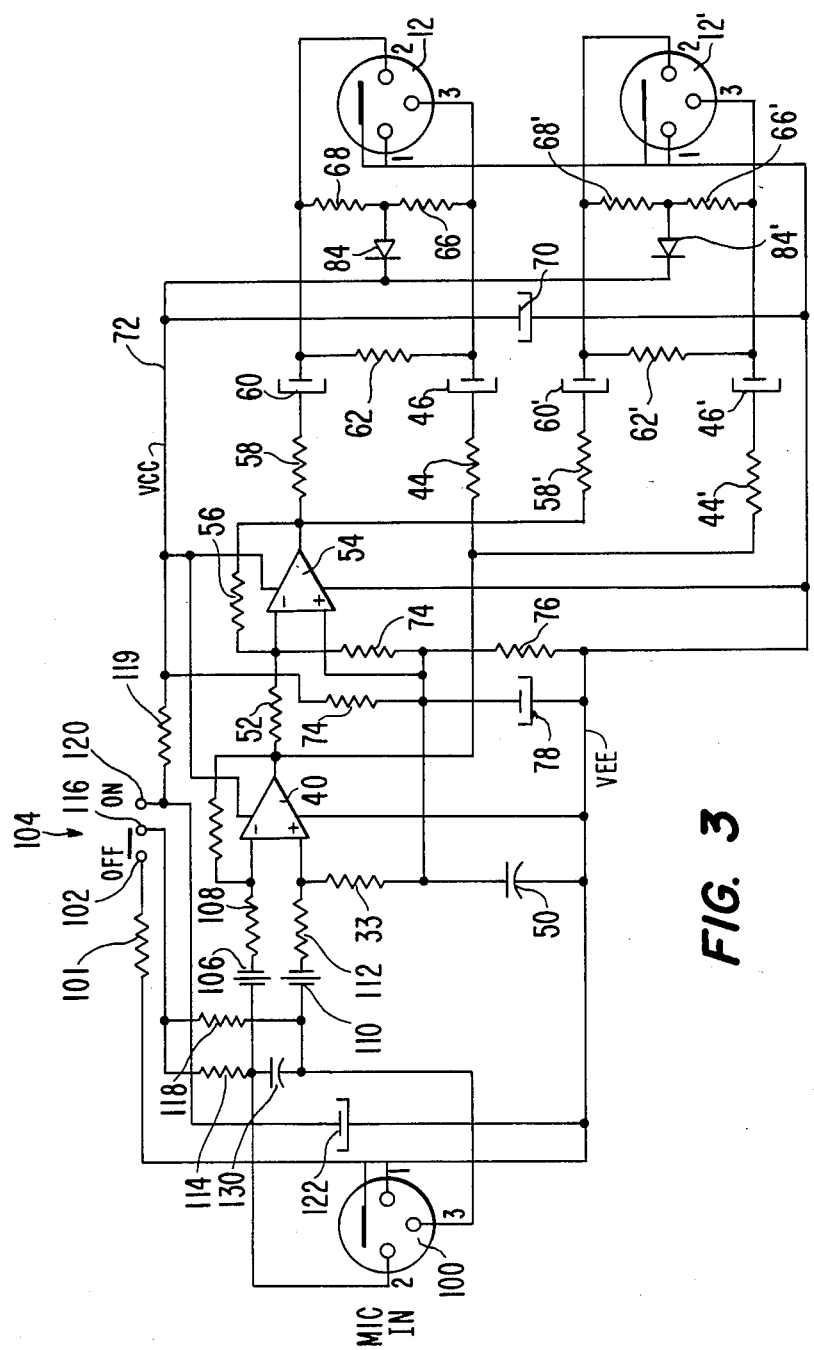
FIG. 3 is a third embodiment of a phantom powered interface circuit according to the present invention.

FIG. 3 shows an embodiment of the invention for use as a phantom powered microphone spliter. This embodiment includes a microphone connector 100 having 3 pins numbered 1, 2 and 3. Pin 1 is connected to ground through pin 1 of connectors 12 and 12'. Pin 1 of connector 100 is also connected through a resistor 101 to a contact 102 of a switch 104.

Pin 2 of connector 100 is connected through a non-polarized capacitor 106 and a resistor 108 to the inverting input of amplifier 40. Similarly, pin 3 of connector 100 is connected through a non-polarized capacitor 110 and a resistor 112 to the non-inverting input of amplifier 40. Pin 2 is also connected through a resistor 114 to the center contact 116 of switch 104. Likewise, pin 3 of connector 100 is connected through a resistor 118 to contact 116. The bias voltage on line 72 is connected through a resistor 119 to a contact 120 of switch 104. A further filter capacitor 122 is also connected to contact 120. Finally, a capacitor 130 is connected between pins 2 and 3 of connector 100 for eliminating rf noise in the input by applying the rf to both inputs of amplifier 40.

The embodiment of FIG. 3 is similar to the embodiment of FIG. 1 except for the lack of an input pad (which may be provided if desired) and the addition of switch 104 for enabling phantom power to be channeled to the microphone. With switch 104 in the position shown, a dynamic microphone may be used so that phantom power is not required. In this condition, contact 116 is connected to contact 102 so that the phantom matrix comprising resistors 114 and 118 is grounded through resistor 101. This prevents the input lines from pins 2 and 3 from floating to a very high potential.

The microphone signal is taken from pins 2 and 3 and provided through blocking capacitors 106 and 110 and input resistances 108 and 112 to the inputs of differential amplifier 40. The output of amplifier 40 is sent to amplifier 54 so that inverted and non-inverted outputs are provided to connectors 12 and 12' as discussed above.

When a condenser microphone is used, switch 104 is moved to its second position so that contact 116 connects to contact 120 thus providing a path for the phantom power through resistors 114 and 118 to pins 2 and 3. In this manner, phantom power is provided to the microphone. Once again, the input signals from the microphone are passed through blocking capacitors 106 and 110 to amplifier 40.

Figure 4:
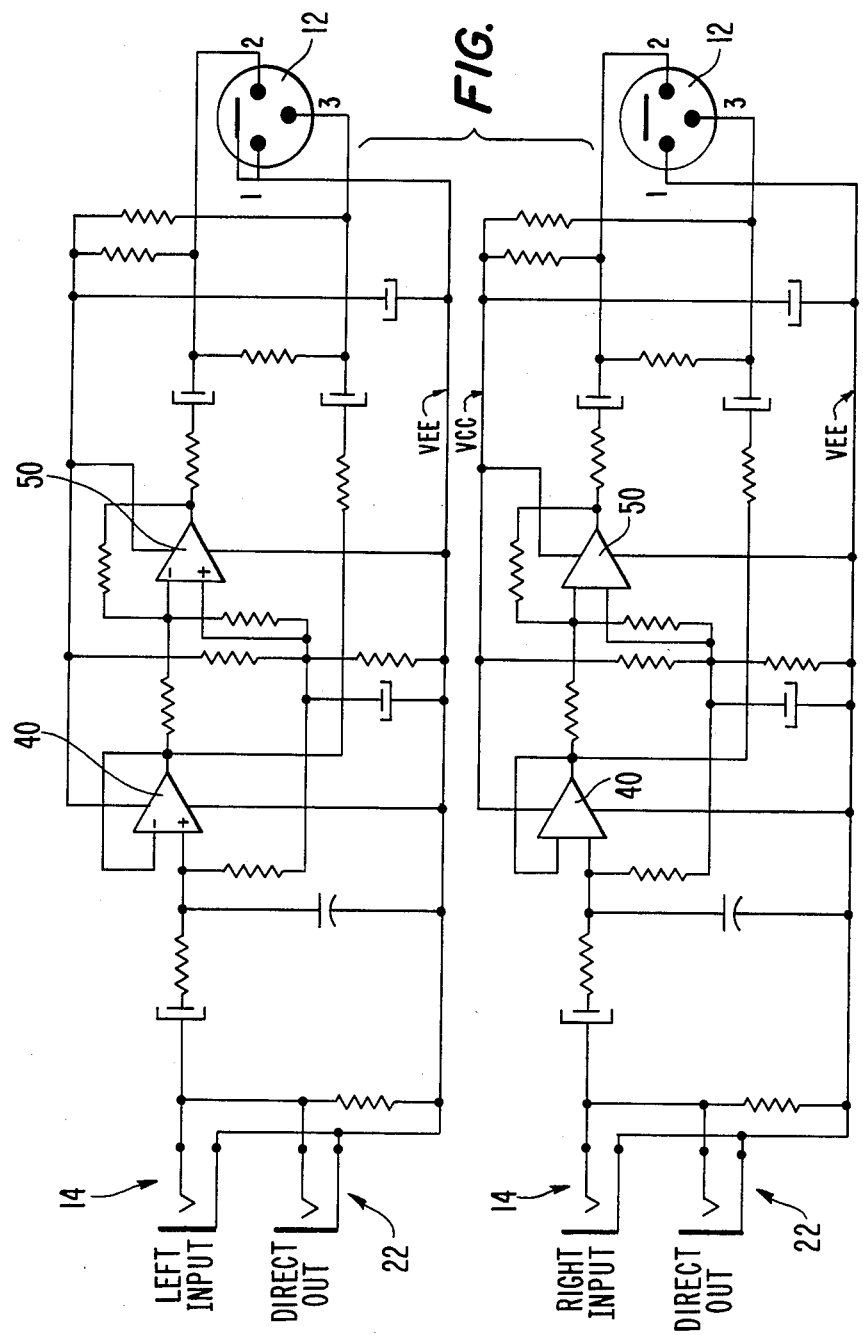
FIG. 4 is a fourth embodiment of a phantom powered interface circuit according to the present invention.

FIG. 4 shows an embodiment of the invention for use with a two channel device. This embodiment includes two circuits which are virtually identical to device 10 of FIG. 1 except for the lack of input pad, which could be provided if required. Essentially, a completely separate circuit is provided for each channel so that the two channels are completely independent. Each channel has a fixed gain for use in line level applications only. Tape players used for sound tracks or stereo output synthesizers match this unit very well. Occasionally, high impedance cable runs create hum and noise when recorded in a remote setting, and the embodiment of FIG. 4 will eliminate such problems.

Other modifications to the invention include the use of circuits similar to those of FIG. 4 except incorporating equalized preamps for RIAA phono use. Such a device can be used in consoles without phono preamps, and eliminates the need for an externally powered preamp module.

Clearly, numerous other additions, substitutions and other modifications can be made to the present invention without departing from the scope thereof, as set forth in the appended claims.

What is claimed is:
1. An apparatus comprising:
a first connector for receiving d.c. power from a current carrying line and providing a.c. signals to said current carrying line;
a second connector for receiving a.c. signals;
an amplifier circuit having an input for receiving a.c. signals from said second connector and having an output for providing a.c. signals to said first connector; and
means for providing said d.c. power to bias said amplifier circuit, comprising means for isolating said d.c. power from said amplifier circuit output, a bias supply line connected to said first connector, and a means for isolating said bias supply line from a.c. signals.

2. An apparatus as set forth in claim 1, wherein said first connector includes, and first and second conductors for carrying said d.c. power, and wherein said amplifier circuit provides inverted and non-inverted a.c. signals, respectively, to said conductors.

3. An apparatus as set forth in claim 2, wherein said first connector further comprises a third conductor for providing a ground connection and said means for isolating said bias supply line from said a.c. signals comprises a first resistor connected between said first conductor and said bias supply line, a second resistor connected between said second conductor and said bias supply line, and a capacitor connected between said bias supply line and said third conductor.

4. An apparatus as set forth in claim 2, wherein said amplifier circuit comprises a first amplifier having an input for receiving a.c. signals from said second connector and for producing a first output, and a second amplifier having an input for receiving said first output signals, said second amplifier being an inverting amplifier and producing second output signals, said first output signals being connected to said first conductor and said second output signals being connected to said second conductor.

5. An apparatus according to claim 1, wherein said means for isolating said d.c. power from said amplifier circuit output comprises a capacitor connected between said amplifier circuit output and said bias supply line and said means for isolating said bias supply line from a.c. signals comprises a capacitor connected between said bias supply line and said third conductor.

6. An apparatus as set forth in claim 1, and further including a third connector for receiving a.c. signals from said amplifier circuit output and providing said a.c. signals to a second current carrying line and receiving d.c. power from said second current carrying line, and a second means for providing d.c. power to bias said amplifier circuit, comprising second isolating means for isolating said d.c. power and said third connector from said amplifier circuit output, and said means for isolating said bias supply line from a.c. signals.

7. An apparatus as set forth in claim 6, further including isolating diodes for isolating said first mentioned means for providing d.c. power from said second means for providing d.c. power such that if d.c. voltages at said first and third connectors are not equal, only the higher voltage will be used to provide d.c. power.

8. An apparatus as set forth in claim 1, further including an input pad connected between said second connector and said amplifier circuit for adjusting the level of a.c. signals at said second connector to a level acceptable by said amplifier circuit.

9. An apparatus as set forth in claim 1, further including transfer means connected to said means for providing said d.c. power to bias said amplifier circuit for selectively providing said d.c. power to said first connector.

10. An apparatus for receiving an unbalanced a.c. signal from an input device and providing a balanced a.c. signal to a console which provides phantom power, comprising:

amplifier means for receiving said unbalanced a.c. signals and providing balanced inverted and non-inverted outputs;

means for receiving said phantom power and isolating said phantom power from said amplifier means;

means for filtering said isolated phantom power; and means for providing said filtered isolated phantom power to bias inputs of said amplifying means.

* * * * *